(12) United States Patent
Ohtorii

(10) Patent No.: US 8,637,878 B2
(45) Date of Patent: Jan. 28, 2014

(54) DISPLAY PANEL, DISPLAY DEVICE, ILLUMINATION PANEL AND ILLUMINATION DEVICE, AND METHODS OF MANUFACTURING DISPLAY PANEL AND ILLUMINATION PANEL

(75) Inventor: Hiizu Ohtorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 157 days.

(21) Appl. No.: 13/246,372

(22) Filed: Sep. 27, 2011

(65) Prior Publication Data

US 2012/0080692 A1  Apr. 5, 2012

(30) Foreign Application Priority Data

Oct. 5, 2010 (JP) .................................. 2010-225958

(51) Int. Cl.
*H01L 33/00* (2010.01)

(52) U.S. Cl.
USPC ................. 257/88; 257/98; 257/100; 438/26; 438/28

(58) Field of Classification Search
USPC .............. 257/88, 98, 100, E33.059, E33.067, 257/E33.056; 438/26, 28
See application file for complete search history.

(56) References Cited

U.S. PATENT DOCUMENTS

| | | | |
|---|---|---|---|
| 7,936,338 B2 * | 5/2011 | Iwase | 345/173 |
| 8,049,318 B2 * | 11/2011 | Sugimoto et al. | 257/680 |
| 2002/0064032 A1 | 5/2002 | Oohata | |
| 2004/0041972 A1 * | 3/2004 | Yanagawa | 349/153 |
| 2004/0259282 A1 | 12/2004 | Oohata | |
| 2005/0194606 A1 * | 9/2005 | Oohata | 257/99 |
| 2007/0029652 A1 * | 2/2007 | Asakawa et al. | 257/667 |
| 2010/0255621 A1 * | 10/2010 | Minato et al. | 438/41 |

FOREIGN PATENT DOCUMENTS

| | | |
|---|---|---|
| JP | 2002-118124 | 4/2002 |
| JP | 2003-168762 | 6/2003 |

\* cited by examiner

*Primary Examiner* — Theresa T Doan
(74) *Attorney, Agent, or Firm* — K&L Gates, LLP

(57) ABSTRACT

Disclosed herein is a display panel including a mounting substrate in which one or more light-emitting devices each including one or more light-emitting elements are mounted on a circuit substrate; and a transparent substrate disposed to face the light-emitting device side of the mounting substrate, wherein the transparent substrate has a transparent base material and a resin layer formed on the mounting substrate side of the transparent base material, and the resin layer is in contact with the light-emitting device and has, formed on an upper surface or a side surface of the light-emitting device, an inclined part which spreads from the light-emitting device side toward the transparent base material side.

16 Claims, 12 Drawing Sheets

DISPLAY PANEL, DISPLAY DEVICE, ILLUMINATION PANEL AND ILLUMINATION DEVICE, AND METHODS OF MANUFACTURING DISPLAY PANEL AND ILLUMINATION PANEL

CROSS REFERENCES TO RELATED APPLICATIONS

The present application claims priority to Japanese Priority Patent Application JP 2010-225958 filed in the Japan Patent Office on Oct. 5, 2010, the entire content of which is hereby incorporated by reference.

BACKGROUND

The present technology relates to a display panel, a display device, an illumination panel and an illumination device which have one or more light-emitting elements, and to methods of manufacturing a display panel and an illumination panel which have one or more light-emitting elements.

In recent years, LEDs (light emitting diodes) have come to be used in various apparatuses such as backlight for liquid crystal displays, display panels for LED displays, and lighting equipment. Attendant on this trend, reductions in the cost of LEDs has come to be keenly demanded. Lowering of the cost of LEDs may need, for example, enhancement of productivity, selection of inexpensive materials, and so on. Besides, in order to lower the power consumption of LEDs or to enhance the output of LEDs, contrivance may be needed to enhance internal quantum efficiency or light extraction efficiency.

For instance, in order to enhance productivity, reductions in the LED chip size have been performed. Furthermore, removal of a substrate which has been used for crystal growth and is present on the light outgoing surface side, adoption of a structure in which no electrode is provided on the light outgoing surfaces of LEDs, and the like have also been conducted generally (see Japanese Patent Laid-open Nos. 2003-168762 and 2002-118124).

SUMMARY

In the case where the chip size is reduced to or below several hundreds of micrometers square or cubic, however, it is difficult to provide the chip with pad electrodes for wire bonding, in other words, electrodes needing a certain extent of largeness. In addition, after removal of the substrate, the chips are so thin that handling of the chips by themselves is difficult to achieve. Therefore, it is impractical to mount the individual chips onto a circuit substrate by use of a mounter.

In view of this problem, it may be contemplated to utilize magnification transfer as follows. First, a support wafer provided with an adhesive layer on a surface thereof is prepared. Next, for example, the surface of the support wafer on the side of the adhesive layer is brought into contact with an LED-side surface of a wafer in which a plurality of LEDs are formed in a matrix pattern on a substrate. Thereafter, by laser lift-off, the LEDs on the basis of a predetermined interval are peeled from the wafer and are transferred onto the support wafer. This coarsens the arrangement pitch of the LEDs. Next, an intermediate (relay or transfer) substrate formed with an electrode pattern is prepared, and the light-emitting elements adhering to the support wafer are transferred onto the intermediate substrate. Thereafter, the LEDs on the intermediate substrate are separated on the basis of a predetermined number of LEDs, by etching. A chip-form light emitting device including one or more LEDs, produced in this way, is mounted onto a circuit substrate (glass substrate). In this manner, a mounting substrate having the LEDs mounted on the circuit substrate can be produced.

Meanwhile, it may be contemplated, for example, to adhere the above-mentioned mounting substrate to a transparent substrate, in order to protect the LEDs. If the transparent substrate is provided over the LEDs, however, part of the light emitted from the LED may be reflected by the back surface of the transparent substrate or confined in the transparent substrate, possibly generating stray light. As a result, the efficiency (light extraction efficiency) with which the light emitted from the LED is extracted from the upper surface (light outgoing surface) of the transparent substrate would be lowered.

Thus, there is a need for a display panel, a display device, an illumination panel and an illumination device, as well as methods of manufacturing a display panel and an illumination panel such that, when a transparent substrate is provided on the light outgoing side, the light extraction efficiency can be restrained from being lowered due to the transparent substrate.

According to an embodiment, there is provided a display panel including: a mounting substrate in which one or more light-emitting devices each including one or more light-emitting elements are mounted on a circuit substrate; and a transparent substrate disposed to face the light-emitting device side of the mounting substrate. The transparent substrate has a transparent base material and a resin layer formed on the mounting substrate side of the transparent base material. The resin layer is in contact with the light-emitting device, and has, formed on an upper surface or a side surface of the light-emitting device, an inclined part which spreads from the light-emitting device side toward the transparent base material side. According to another embodiment, there is provided a display device including the above-mentioned display panel and a driving part which drives the display panel.

According to a further embodiment, there is provided an illumination panel including: a mounting substrate in which one or more light-emitting devices each including one or more light-emitting elements are mounted on a circuit substrate; and a transparent substrate disposed to face the light-emitting device side of the mounting substrate. The transparent substrate has a transparent base material and a resin layer formed on the mounting substrate side of the transparent base material. The resin layer is in contact with the light-emitting device, and has, formed on an upper surface or a side surface of the light-emitting device, an inclined part which spreads from the light-emitting device side toward the transparent base material side. According to yet another embodiment, there is provided an illumination device including the above-mentioned illumination panel and a driving part which drives the illumination panel.

In the display panel, the display device, the illumination panel and the illumination device according to embodiments, the resin layer formed on the back side of the transparent base material and making contact with the light-emitting device has, formed on an upper surface of a side surface of the light-emitting device, an inclined part which spreads from the light-emitting device side toward the transparent base material side. This ensures that when the light-emitting device is driven to emit light, the light emitted obliquely from the light-emitting device is reflected by the surface of the inclined part toward the transparent base material side, and the thus reflected light is transmitted through the transparent base material, to go out to the exterior.

In a method of manufacturing a display panel according to a yet further embodiment and in a method of manufacturing an illumination panel according to still another embodiment, a mounting substrate in which one or more light-emitting devices each including one or more light-emitting elements are mounted on a circuit substrate and a transparent substrate having a liquid or gel-form curable resin layer on a transparent base material are adhered to each other so as to bring the light-emitting device and the curable resin layer into contact with each other, whereby an inclined part spreading from the light-emitting device side toward the transparent substrate side is formed in that part of the curable resin layer which makes contact with the light-emitting device.

The method of manufacturing a display panel according to the yet further embodiment and in the method of manufacturing an illumination panel according to the still another embodiment are so configured that in adhering the mounting substrate and the transparent substrate to each other, the light-emitting device on the mounting substrate and the curable resin layer on the transparent substrate are brought into contact with each other, whereby the inclined part spreading from the light-emitting device side toward the transparent base material side is formed in that part of the curable resin layer which makes contact with the light-emitting device. This ensures that, when the light-emitting device is driven to emit light, the light emitted obliquely from the light-emitting device is reflected by the inclined part toward the transparent base material side, and the thus reflected light is transmitted through the transparent base material, to go out to the exterior.

Meanwhile, in the above-mentioned embodiments, a surface of the inclined part may, for example, be paraboloidal in shape. In addition, in the above-mentioned embodiments, the light-emitting device may have a projection formed in that region of the upper surface of the light-emitting device which faces the light-emitting element. In this case, preferably, the inclined part is formed on a side surface of the projection. Besides, in the above-mentioned embodiments, a surface on the resin layer side of the transparent base material may, for example, be a rough surface. In addition, in the above-mentioned embodiments, the mounting substrate may be provided with a plurality of struts which regulate the spacing between the mounting substrate and the transparent substrate. Besides, in the above-mentioned embodiments, the mounting substrate may have a wiring pattern electrically connected to the light-emitting device and have a light-absorbing layer in at least that region in which the wiring pattern is not formed. In addition, in the above-mentioned embodiments, the transparent substrate may have a light-absorbing layer between the transparent base material and the resin layer and in that region which does not face the light-emitting element.

The display panel, the display device, the illumination panel and the illumination device according to embodiments, the method of manufacturing a display panel according to an embodiment and the method of manufacturing an illumination panel according to an embodiment, have a configuration in which when the light-emitting device is driven to emit light, the light emitted obliquely from the light-emitting device is reflected by the inclined part toward the transparent base material side and is transmitted through the transparent base material, to go out to the exterior. Therefore, light extraction efficiency can be restrained from being lowered due to the presence of the transparent substrate on the light outgoing side.

Besides, in the above-mentioned embodiments, in the case where the projection is provided in that region of the upper surface of the light-emitting device which faces the light-emitting element and the inclined part is formed on the side surface of the projection or where the surface on the resin layer side of the transparent base material is a rough surface, the light emitted obliquely from the light-emitting device can be extracted to the exterior more assuredly. As a result, the lowering in the light extraction efficiency due to the transparent substrate can be restrained more securely. In addition, in the above-mentioned embodiments, in the case where the mounting substrate is provided with a plurality of struts which regulate the spacing between the mounting substrate and the transparent substrate, the light extraction efficiency can be restrained from being partially lowered in plane. Consequently, the lowering in the light extraction efficiency due to the transparent substrate can be restrained further reliably.

Additional features and advantages are described herein, and will be apparent from the following Detailed Description and the figures.

DETAILED DESCRIPTION

Embodiments of the present application will be described below in detail with reference to the drawings.
1. First Embodiment (FIGS. 1 to 5)
2. Modifications of First Embodiment (FIGS. 6 to 13)
3. Second Embodiment (FIGS. 14 to 17D)

1. First Embodiment

Configuration

Figure 1:
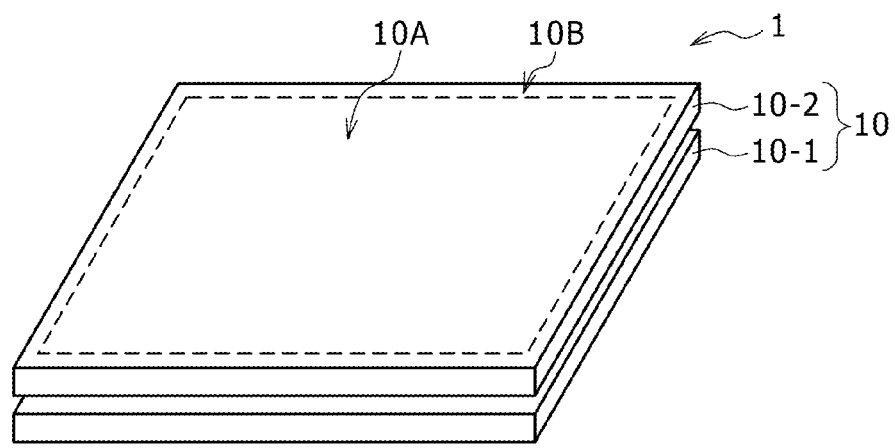
FIG. 1 is a perspective view illustrating an example of a display device according to a first embodiment.

FIG. 1 is a perspective view showing an example of general configuration of a display device 1 according to an embodiment. The display device 1 according to the present embodiment is one being so-called LED display, in which LEDs are used as display pixels. As for example shown in FIG. 1, the display device 1 includes a display panel 10 and a driving IC (integrated circuit) (not shown).

Display Panel 10

The display panel 10 has a mounting substrate 10-1 and a transparent substrate 10-2 stacked over each other. A face side of the transparent substrate 10-2 constitute a picture display surface, which has a display region 10A in a central area thereof and a frame region 10B, which is a non-display region, in the periphery of the display region 10A.

Figure 2:
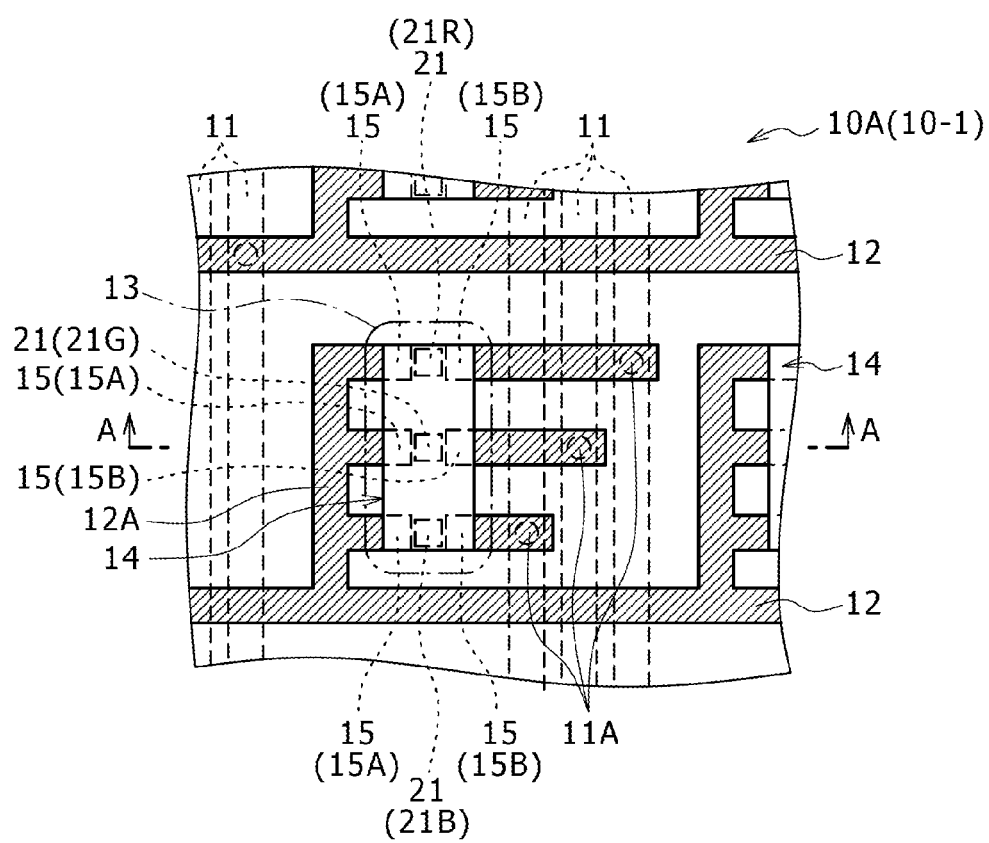
FIG. 2 is a plan view showing an example of layout in a surface of a mounting substrate shown in FIG. 1.
Figure 3:
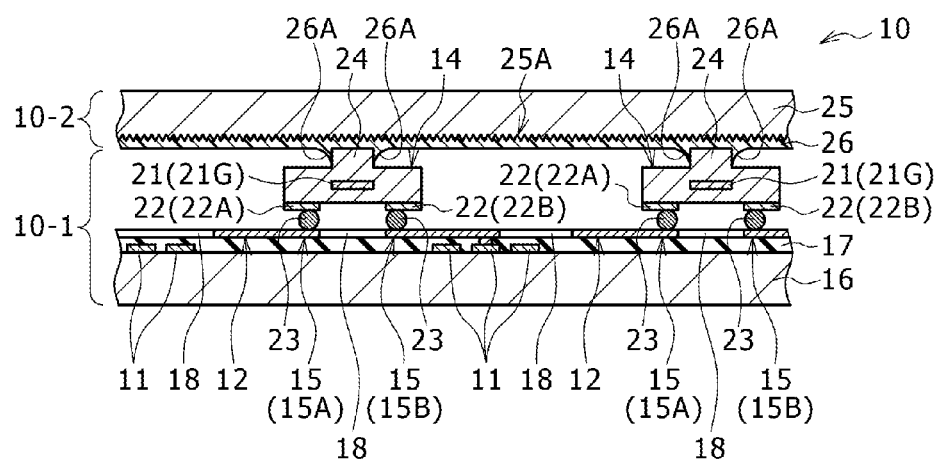
FIG. 3 is a sectional view showing an example of sectional configuration of that part of the display device of FIG. 1 which corresponds to line A-A of FIG. 2.
Figure 4:
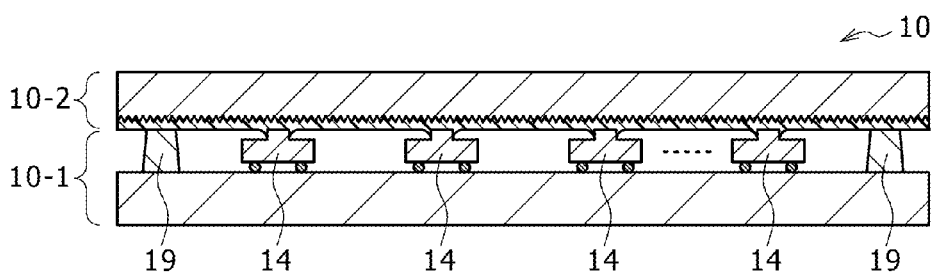
FIG. 4 is a sectional view showing an example of total sectional configuration of the display device of FIG. 1.

FIG. 2 shows an example of layout in that region of the surface of the mounting substrate 10-1 on the transparent substrate 10-2 side which corresponds to the display region 10A. FIG. 3 shows an example of sectional configuration of that part of the display device 1 of FIG. 1 which corresponds to line A-A of FIG. 2. FIG. 4 shows an example of total sectional configuration of the display device 1 of FIG. 1.

Mounting Substrate 10-1

In that region of the face side of the mounting substrate 10-1 which corresponds to the display region 10A, as for example shown in FIG. 2, a plurality of data wires 11 are formed to extend in a predetermined direction and to be arranged at a predetermined pitch. In that region of the face side of the mounting substrate 10-1 which corresponds to the display region 10A, further, a plurality of scan wires 12, for example, are formed to extend in a direction intersecting with (for example, orthogonal to) the data wires 11 and to be arranged at a predetermined pitch. The data wires 11 and the scan wires 12 are formed from a conductive material such as Cu (copper), for example.

The scan wires 12 are formed, for example, in a surfacemost layer; for instance, as shown in FIG. 3, the scan wires 12 are formed on an insulating layer 17 formed on the surface of a base material 16. Incidentally, the base material 16 is composed, for example, of a glass substrate, a resin substrate or the like, whereas the insulating layer 17 is formed, for example, from SiN, SiO2 or Al2O3. On the other hand, the data wires 11 are formed in a layer different from the surfacemost layer including the scan wires 12 (for example, in a later below the surfacemost layer). For instance, the data wires 11 are formed in the insulating layer 17, as shown in FIG. 3. On the surface of the insulating layer 17, black 18 is provided in addition to the scan wires 12. The black 18 is for enhancing contrast, and is formed from a light-absorbing material. The black 18 is formed, for example, in those areas of the surface of the insulating layer 17 in which a pad electrode 15 (described later) is not formed.

A display pixel 13 is formed in the vicinity of each of intersection areas of the data wires 11 and the scan wires 12, and a plurality of display pixels 13 are arranged in a matrix pattern in the display region 10A. As shown in FIGS. 2 and 3, for example, a light-emitting device 14 including a plurality of light emitting elements 21 is mounted in each display pixel 13. Incidentally, in FIG. 2, there is shown a case wherein one display pixel 13 is composed of three light-emitting elements 21 (21R, 21G, and 21B) so that red light can be outputted from the light-emitting element 21R, green light from the light-emitting element 21G, and blue light from the light-emitting element 21B. The light-emitting elements 21 are, for example, LEDs.

As shown in FIG. 3, for example, the light-emitting device 14 is provided with one pair of electrodes 22 for each light-emitting element 21. One (22A) of the pair of electrodes 22 is electrically connected to the scan wire 12, and the other (22B) of the pair of electrode 22 is electrically connected to the data wire 11. The electrode 22A is, for example, connected to a pad electrode 15 (15A) at the tip of a branch 12A, provided as part of the scan wire 12, through a solder 23. In addition, the electrode 22B is, for example, connected to a pad electrode 15 (15B) at the tip of a branch 11A, provided as part of the data wire 11, through a solder 23. Incidentally, though not shown in the drawings, the electrodes 22 (22A, 22B) may be connected to the pad electrodes 15 (15A, 15B) through a plating layer or the like. Each of the pad electrodes 15 is formed, for example, in the surfacemost layer. For example, as shown in FIG. 2, each of the pad electrodes 15 is formed in an area where each light-emitting device 14 is mounted. Here, the pad electrodes 15 (15A, 15B) and the electrodes 22 (22A, 22B) are formed from a conductive material such as Au (gold), for example. The solder 23 is composed, for example, of an alloy containing lead and tin as main ingredients.

In addition, the light-emitting element 21 is also provided with a pair of electrodes (not shown) for feeding a current into the light-emitting element 21. One of the pair of electrodes is electrically connected to the pad electrode 15A, while the other is electrically connected to the pad electrode 15B. Of the pair of electrodes for the light-emitting element 21, one is formed, for example, on an upper surface of the light-emitting element 21, whereas the other is formed, for example, on a lower surface of the light-emitting element 21. Incidentally, the pair of electrodes for the light-emitting element 21 may be provided at other positions than the just-mentioned. For instance, the pair of electrodes for the light-emitting element 21 may be both formed on the lower surface of the light-emitting element 21.

In the light-emitting device 14, a transparent member including a transparent resin or the like is provided on the upper side of each light-emitting element 21. At that part of the transparent member which corresponds to the direct upper side of the light-emitting element 21 (a region facing the light-emitting element 21), a projection 24 projecting toward the side of the transparent substrate 10-2 is provided. The projection 24 is, for example, cylindrical in shape. In this case, the diameter of the cylinder is, for example, 15 μm and the height of the cylinder is, for example, 5 μm. The height of the projection 24 is so set as to permit a fillet 26A to be formed on a side surface of the projection 24 in a manufacturing process, and is set, for example, greater than the thickness of a resin layer 26D which will be described later.

Furthermore, the mounting substrate 10-1 is provided with a plurality of struts 19 for regulating the spacing between the mounting substrate 10-1 and the transparent substrate 10-2, as shown in FIG. 4. The height of the strut 19 is, for example, so set that the top surface of the strut 19 and the top surface of the projection 24 are contained in the same plane. The struts 19 may be provided in a region facing the display region 10A, or may be provided in a region facing the frame region 10B.

Transparent Substrate 10-2

The transparent substrate 10-2 includes, for example, a transparent base material 25 and a resin layer 26 formed on the mounting substrate 10-1 side of the transparent base material 25, as shown in FIG. 3. The transparent base material 25 is composed, for example, of a glass substrate, a resin substrate or the like. The resin layer 26 is formed, for example, from a light-transmitting adhesive, and is, for example, a cured product of a liquid or gel-form curable resin.

Of the transparent base material 25, a surface on the light-emitting device 14 side (a surface in contact with the resin layer 26) is, for example, a rough surface 25A as shown in FIG. 3. The rough surface 25A may be provided over the whole area of a region facing the display region 10A, or may be provided only in regions facing the display pixels 13. The rough surface 25A has ruggedness (projection-and-recess pattern) which is so fine that, when light emitted from the light-emitting element 21 is incident on the rough surface 25A, the incident light is scattered. The ruggedness of the rough surface 25A can be produced, for example, by sand-blast, dry etching or the like.

The resin layer 26 is, for example, in contact with the light-emitting devices 14, as shown in FIG. 3, and is provided directly on the upper side of each light-emitting device 14 with a fillet 26A (inclined part) spreading from the light-emitting device 14 side toward the transparent base material 25 side. The fillet 26A is provided on a side surface of the projection 24. The surface of the fillet 26A is, for example, paraboloidal in shape, as shown in FIG. 3. Though not shown, the fillets 26A are formed, for example, by bringing the liquid or gel-form curable resin layer provided on the transparent base material and the light-emitting device 14 into contact with each other so that part of the curable resin layer is sucked up along the surfaces of the light-emitting devices 14, in the manufacturing process. The fillet 26A is for permitting the light emitted obliquely from the light-emitting element 21 to be reflected on the surface of the fillet 26A toward the transparent base material 25 side; thus, the fillet 26A functions as a reflector.

Driving IC

The driving IC is composed, for example, of a data driver for driving the data wires 11 connected to the display pixels 13, and a scan driver for driving the scan wires 12 connected to the display pixels 13. The driving IC may, for example, be mounted on the mounting substrate 10-1, or may be provided as a separate body from the display panel 10 and connected to the mounting substrate 10-1 through a wiring (not shown).

Method of Manufacturing Display Panel 10

Figure 5A:
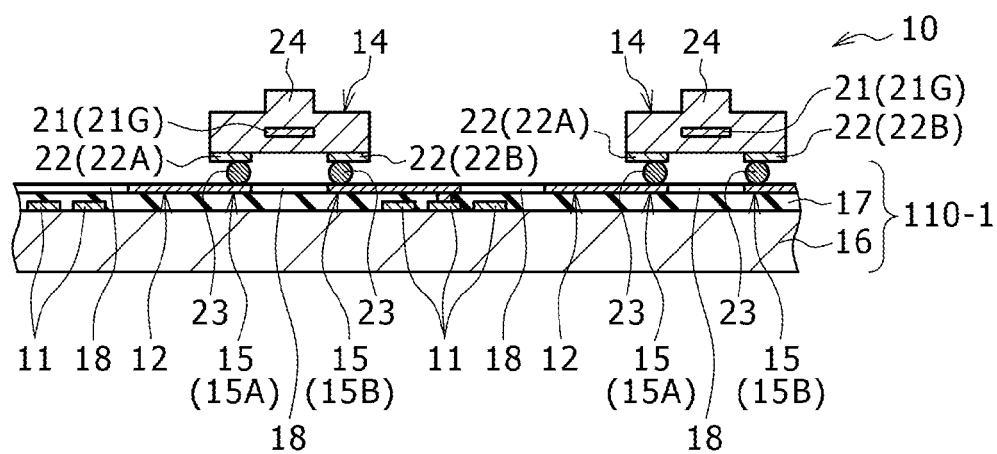
FIGS. 5A to 5D are sectional views for illustrating an example of a process of manufacturing the display panel of FIG. 1.
Figure 5B:
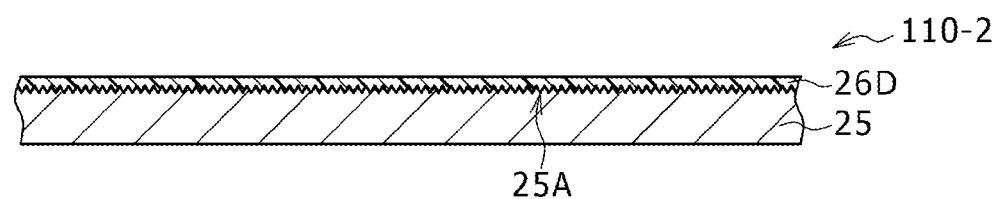
Figure 5C:
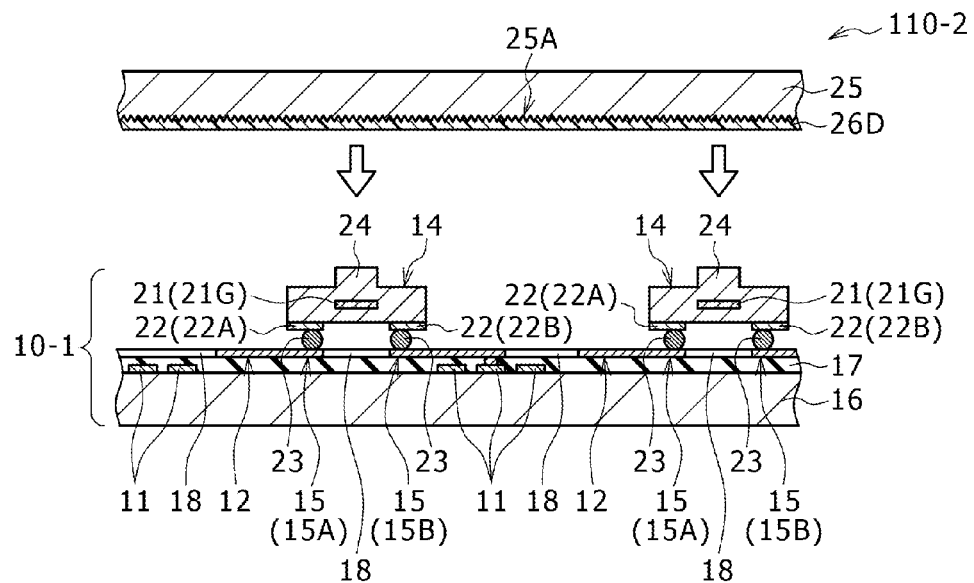
Figure 5D:
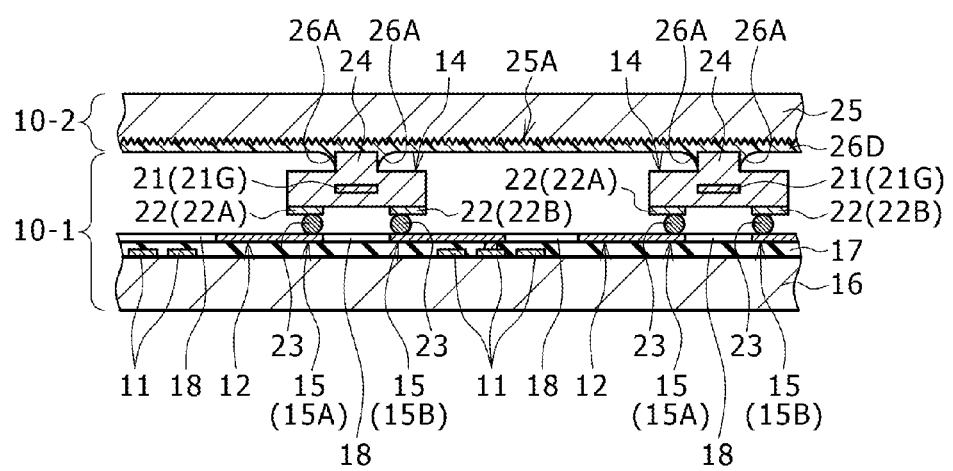

Now, an example of the method of manufacturing the display panel 10 according to the present embodiment will be described below, referring to FIGS. 5A to 5D. FIGS. 5A and 5B are sectional views for illustrating an example of a process of manufacturing the display panel 10. FIGS. 5C and 5D are sectional views for illustrating manufacturing steps subsequent to FIGS. 5A and 5B.

First, for example, a plurality of light-emitting devices 14 are mounted on a circuit substrate 110-1 having formed on the base material 16 the insulating layer 17 including a plurality of data wires 11 therein, a wiring pattern (the scan wires 12 and the pad electrodes 15) and the black 18 (FIG. 5A). Thereafter, reflow is applied to the circuit substrate 110-1, whereby the electrodes 22 of the light-emitting devices 14 are bonded to the pad electrodes 15 through the solder 23. As a result, the mounting substrate 10-1 is formed. Incidentally, the electrodes 22 of the light-emitting devices 14 may be bonded to the pad electrodes 15 by a plating treatment, without using the solder 23. Subsequently, for example, a liquid or gel-form curable resin layer 26D is formed on the transparent substrate 25 (FIG. 5B). By this, a transparent substrate 110-2 is formed. The resin layer 26D is formed, for example, by use of spin coating or the like.

Next, the mounting substrate 10-1 and the transparent substrate 110-2 are so disposed as to cause the light-emitting devices 14 and the resin layer 26D to face each other, and, further, they are adhered to each other so that the light-emitting devices 14 make contact with the resin layer 26D (FIGS. 5C and 5D). In this case, a pressure is applied to the mounting substrate 10-1 and the transparent substrate 110-2 so that the load on each of the projections 24 is about 0.1 g, for example. As a result, the fillet 26A spreading from the light-emitting device 14 side toward the transparent substrate 110-2 side is formed at that part of the resin layer 26D which is in contact with each of the light-emitting devices 14, as shown in FIG. 6B. Thereafter, the resin layer 26D is dried, to solidify the fillets 26A (not shown). In this way, the display panel 10 according to the present embodiment is manufactured.

Operation and Effect of Display Device 1

In the present embodiment, the light-emitting devices 14 are driven by the driving IC through the data wires 11 and the scan wires 12 which are laid out in a simple matrix (simple matrix driving). This ensures that the light-emitting devices 14 provided in the vicinity of the intersection areas of the data wires 11 and the scan wires 12 are sequentially supplied with a current, whereby an image is displayed in the display region 10A.

Meanwhile, in the present embodiment, in adhering the mounting substrate 10-1 and the transparent substrate 110-2 to each other, the light-emitting devices 14 on the mounting substrate 10-1 and the resin layer 26D on the transparent substrate 110-2 are brought into contact with each other, and the fillets 26A spreading from the light-emitting device 14 side toward the transparent base material 25 side are formed at those portions of the resin layer 26D which make contact with the light-emitting devices 14. This ensures that when the light-emitting device 14 is driven to emit light, the light emitted obliquely from the light-emitting device 14 is reflected by the fillet 26A toward the transparent base material 25 side, and the thus reflected light is transmitted through the transparent base material 25, to go out to the exterior. As a result, the possibility of a phenomenon in which part of the light emitted obliquely from the light-emitting device 14 is reflected on the back surface of the transparent substrate 10-2 or is confined in the transparent base material 25, generating stray light, can be lowered. Accordingly, light extraction efficiency can be restrained from being lowered due to the presence of the transparent substrate 10-2 on the light outgoing side.

In addition, in the present embodiment, the projection 24 is provided in that region of the top surface of the light-emitting device 14 which faces the light-emitting element 21, and the fillet 26A is formed on the side surface of the projection 24, so that the light emitted obliquely from the light-emitting device 14 can be extracted with a more enhanced efficiency. This ensures that the light extraction efficiency can be further restrained from being lowered due to presence of the transparent substrate 10-2.

Besides, in the present embodiment, the surface of the transparent base material 25 on the resin layer 26 side is the rough surface 25A, so that part of the light emitted obliquely from the light-emitting device 14 is scattered on the rough surface 25A. This ensures that part of the scattered light is transmitted through the transparent base material 25, to go out to the exterior. Therefore, the possibility of a phenomenon in which the light emitted obliquely from the light-emitting device 14 is reflected on the back surface of the transparent substrate 10-2 or is confined in the transparent base material 25, generating stray light, can be lowered. Consequently, the light extraction efficiency can be more restrained from being lowered due to the transparent substrate 10-2.

In addition, in the present embodiment, the mounting substrate 10-1 is provided with the plurality of struts 19 which regulate the spacing between the mounting substrate 10-1 and the transparent substrate 10-2, so that the spacing between the mounting substrate 10-1 and the transparent substrate 10-2 can be made uniform in plane. This makes it possible to make the shape of the fillets 26A uniform in plane, and therefore to restrain the light extraction efficiency from being partially lowered in plane. Consequently, the light extraction efficiency can be further restrained from being lowered due to the transparent substrate 10-2.

Besides, in the present embodiment, the black 18 is provided at the surface of the mounting substrate 10-1, so that it is unnecessary to provide a black on the transparent substrate 10-2 side. This eliminates the need for alignment in adhering the mounting substrate 10-1 and the transparent substrate 110-2 to each other in the manufacturing process, thereby leading to an enhanced productivity.

In addition, in the present embodiment, the electrodes 22 of the light-emitting devices 14 are connected to the pad electrodes 15 through the solder 23. This ensures that, even when the electrodes 22 of the light-emitting device 14 is for example mounted at locations slightly deviated from the centers of the pad electrodes 15 in the manufacturing process, the later reflow permits the electrodes 22 of the light-emitting device 14 to spontaneously move to the centers of the pad electrodes 15. Accordingly, the trouble arising from misalignment of the light-emitting devices 14 can be substantially eliminated.

Besides, in the present embodiment, no aperture is provided on the transparent substrate 10-2 side for the purpose of enhancing the light extraction efficiency, and, therefore, unevenness of view angle can be reduced.

2. Modifications of First Embodiment

Figure 6:
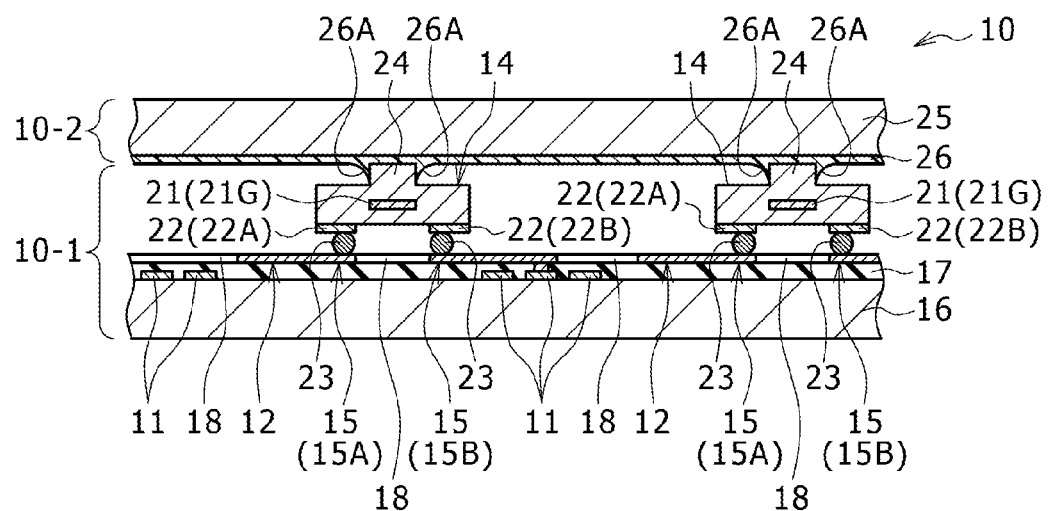
FIG. 6 is a sectional view of a first modification of the display device of FIG. 1.

While the surface of the transparent base material 25 on the resin layer 26 side is the rough surface 25A in the above-described embodiment, this surface may, for example, be a flat surface, as shown in FIG. 6.

Figure 7:
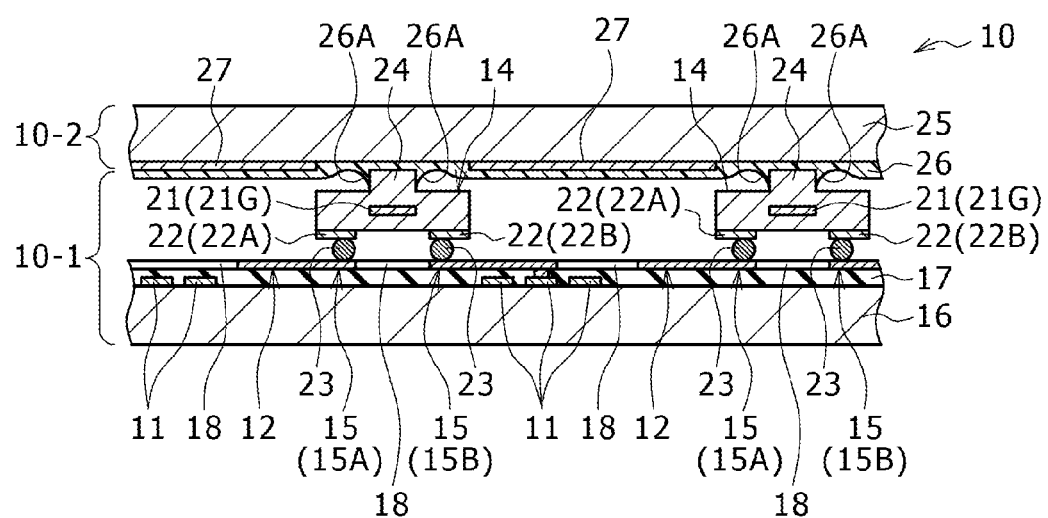
FIG. 7 is a sectional view of a second modification of the display device of FIG. 1.

In addition, while the black 18 is provided on the mounting substrate 10-1 in the above embodiment, the black 18 may be omitted. It should be noted in this case, however, that for obtaining an enhanced contrast, for example, a black 27 is preferably provided on the transparent substrate 10-2 side, as shown in FIG. 7. Like the black 18, the black 27 is for enhancing the contrast, and is formed from a light-absorbing material. The black 27 is formed, for example, between the transparent base material 25 and the resin layer 26 and in those regions which do not face the light-emitting elements 21, as shown in FIG. 7.

Figure 8:
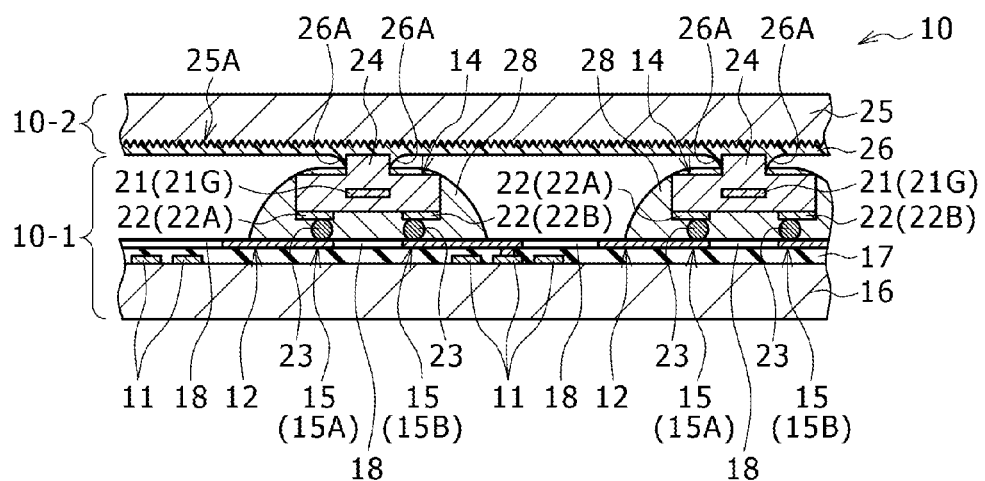
FIG. 8 is a sectional view of a third modification of the display device of FIG. 1.

Besides, while the light-emitting device 14 is not covered with any material but exposed in the above-described embodiment, a lens-shaped covering part (lens part 28) covering entirely or partly that portion of the light-emitting device 14 which is not covered with the resin layer 26 may, for example, be provided as shown in FIG. 8. The upper surface of the lens part 28 is, for example, spherical in shape as shown in FIG. 8. This ensures that rays of light emitted from the light-emitting device 14 are refracted so that the paths of the rays become more parallel to the normal to the transparent base material 25. As a result, part of the scattered light is transmitted through the transparent base material 25, to go out to the exterior. Therefore, the possibility of a phenomenon in which part of the light emitted obliquely from the light-emitting device 14 is reflected on the back surface of the transparent substrate 10-2 or is confined in the transparent base material 25, thereby generating stray light, can be lowered. Accordingly, the light extraction efficiency can be further restrained from being lowered due to the transparent substrate 10-2. Incidentally, in the case where the lens parts 28 are provided, if the spacing between the mounting substrate 10-1 and the transparent substrate 10-2 becomes uneven in plane, the fillets 26A and the lens parts 28 may overlap with each other, and the quantity of light extracted may be scattered in plane. In this modification, however, the struts 19 are provided between the mounting substrate 10-1 and the transparent substrate 10-2; therefore, it is possible, by regulating the heights of the struts 19, to prevent the fillets 26A and the lens parts 28 from overlapping with each other.

Figure 9:
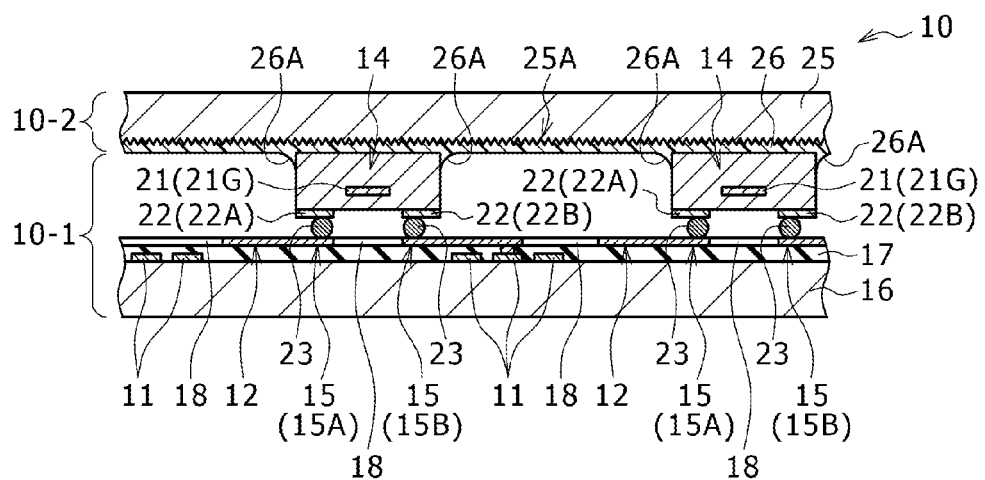
FIG. 9 is a sectional view of a fourth modification of the display device of FIG. 1.
Figure 10:
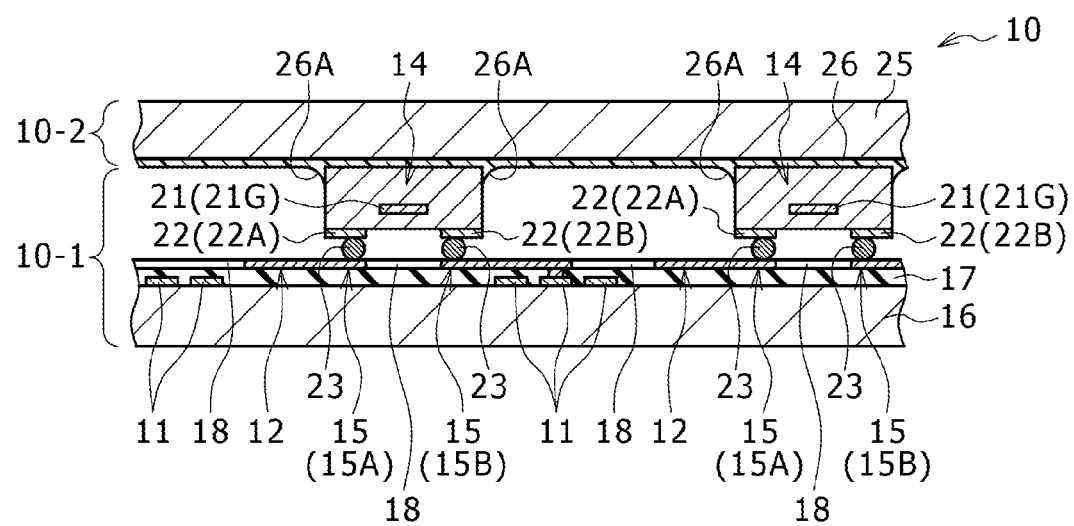
FIG. 10 is a sectional view of a fifth modification of the light-emitting device shown in FIG. 1.
Figure 11:
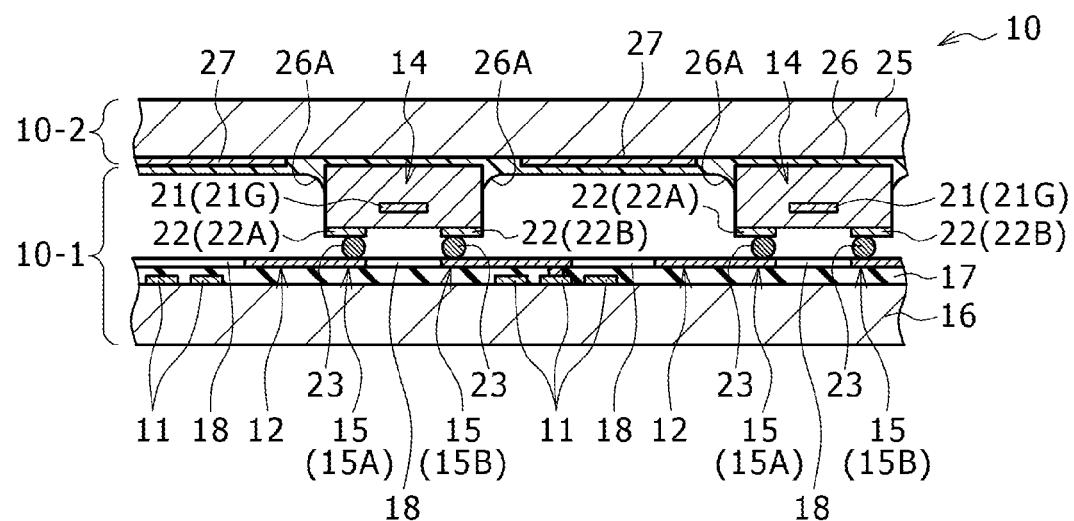
FIG. 11 is a sectional view of a sixth modification of the light-emitting device shown in FIG. 1.

In addition, while the projections 24 are provided on the top surfaces of the light-emitting devices 14 in the above-described embodiment, the top surfaces of the light-emitting devices 14 may, for example, be flat surfaces as shown in FIGS. 9, 10 and 11. In this case, as for example shown in FIGS. 9, 10 and 11, the resin layer 26 is in contact with not only the top surfaces of the light-emitting devices 14 but also the side surfaces of the light-emitting devices 14, and the fillets 26A are formed on the side surfaces of the light-emitting devices 14. In this instance, the fillet 26A is spreading from the side surface of the light-emitting device 14 toward the transparent base material 25 side.

Figure 12:
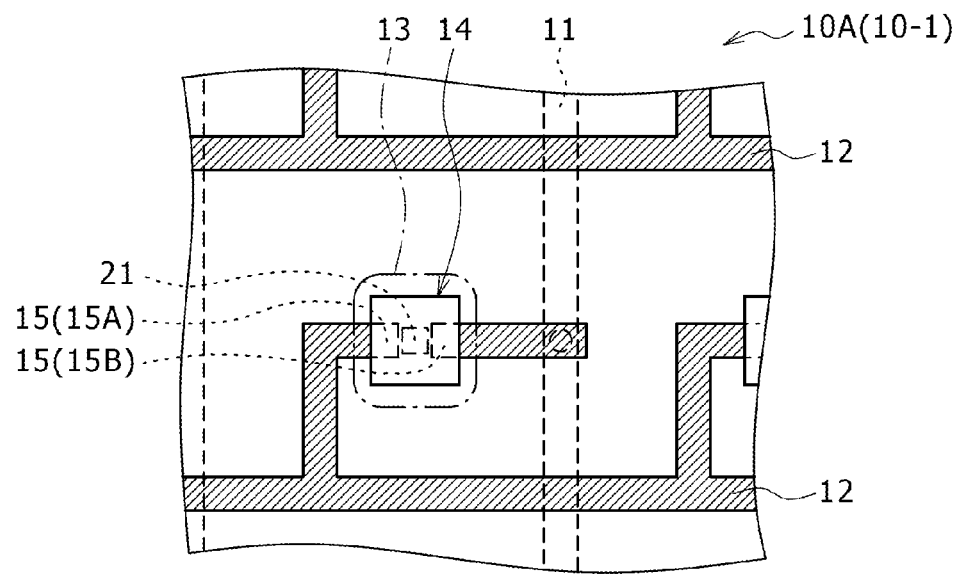
FIG. 12 is a plan view showing a modification of layout in the surface of the mounting substrate shown in FIG. 1.

Besides, while the light-emitting device 14 includes the three light-emitting elements 21 in the above embodiment, the number of the light-emitting elements 21 included in each light-emitting device 14 may be less than three or may be four or more. For example, the light-emitting device 14 may include only one light-emitting element 21, as shown in FIG. 12.

Figure 13:
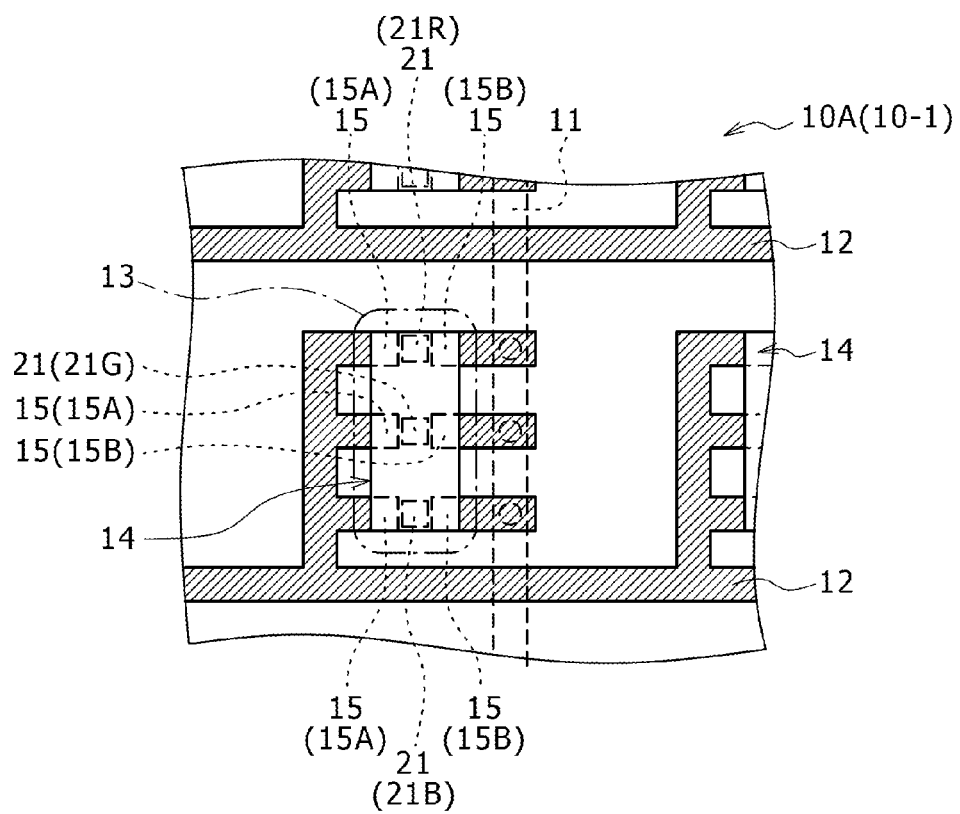
FIG. 13 is a plan view showing another modification of the layout in the surface of the mounting substrate shown in FIG. 1.

In addition, while the light-emitting elements 21 in each light-emitting device 14 are connected respectively to different data wires 11 in the above-described embodiment, they may be connected, for example, to the same data wire 11, as shown in FIG. 13.

3. Second Embodiment

Configuration

Figure 14:
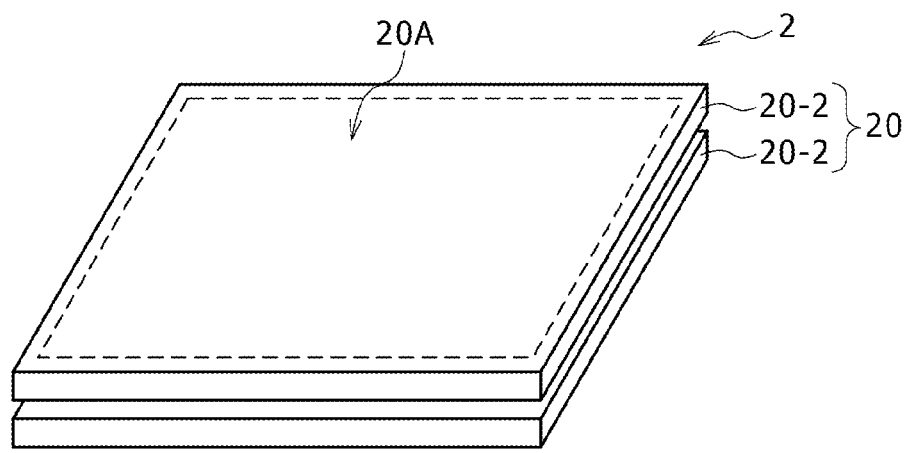
FIG. 14 is a perspective view illustrating an example of an illumination device according to a second embodiment.

FIG. 14 is a perspective view showing an example of general configuration of an illumination device 2 according to a second embodiment. The illumination device 2 according to the present embodiment is one being so-called LED illumination, wherein LED is used as a light source. As shown in FIG. 14, the illumination device 2 includes, for example, an illumination panel 20 and a driving IC (not shown).

Illumination Panel 20

The illumination panel 20 has a mounting substrate 20-1 and a transparent substrate 20-2 which are stacked over each other. A surface of the transparent substrate 20-2 constitutes a surface from which illumination light is outputted, and which has an illumination region 20A in a central area thereof.

Figure 15:
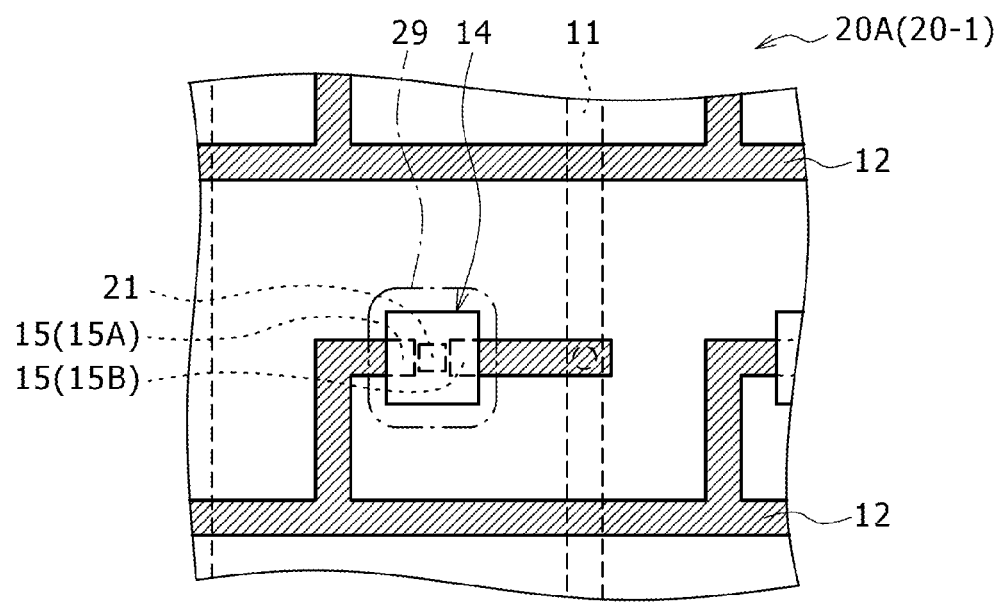
FIG. 15 is a plan view showing an example of layout in the surface of the mounting substrate shown in FIG. 14.
Figure 16:
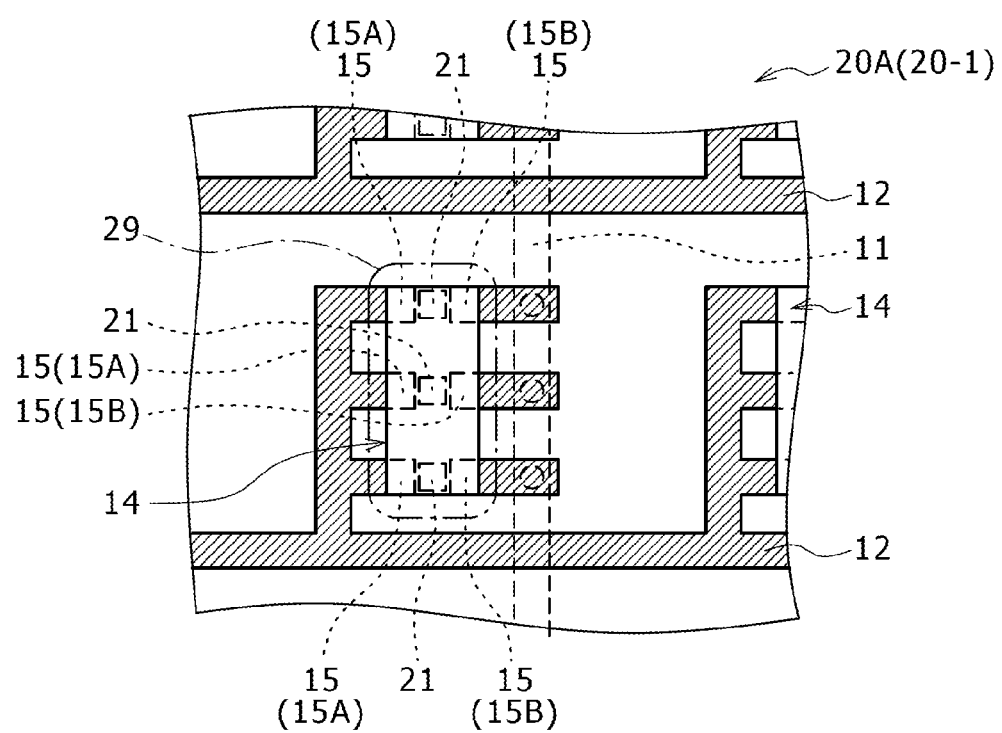
FIG. 16 is a plan view showing another example of the layout in the surface of the mounting substrate shown in FIG. 14.

FIGS. 15 and 16 illustrate examples of layout in that region of the surface of the mounting substrate 20-1 on the transparent substrate 20-2 side which corresponds to the illumination region 20A. Sectional configurations at the parts corresponding to lines A-A in FIGS. 15 and 16 are, for example, the same as the sectional configuration shown in FIG. 3, 4, 6, 7, 8, 9, 10 or 11. Incidentally, in the present embodiment, the black 18, 27 shown in FIGS. 3, 6, 7, 8, 9, 10 and 11 may be omitted. Besides, in the present embodiment, an element corresponding to the display pixel 13 shown in FIG. 2 is an illumination pixel 29.

Driving IC

A driving IC is composed, for example, of a data driver for driving data wires 11 connected to the illumination pixels 29, and a scan driver for driving scan wires 12 connected to the illumination pixels 29. The driving IC may, for example, be mounted on the mounting substrate 20-1 or may be provided as a separate body from the illumination panel 20.

Method of Manufacturing Illumination Panel 20

Figure 17A:
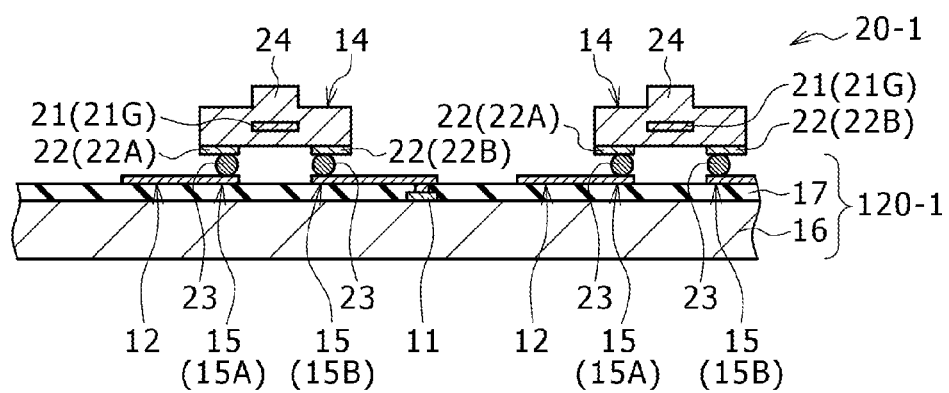
FIGS. 17A to 17D are sectional views for illustrating an example of a process of manufacturing the illumination panel of FIG. 14.
Figure 17B:
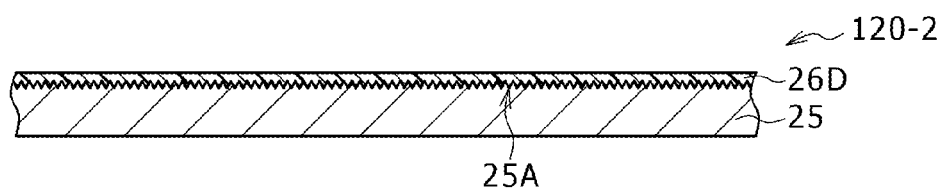
Figure 17C:
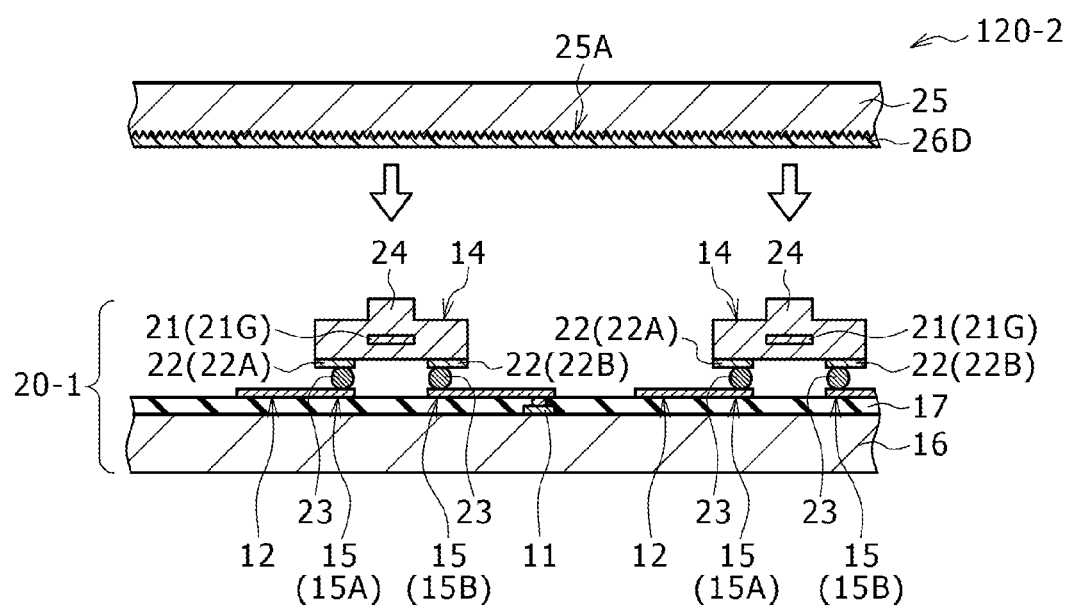
Figure 17D:
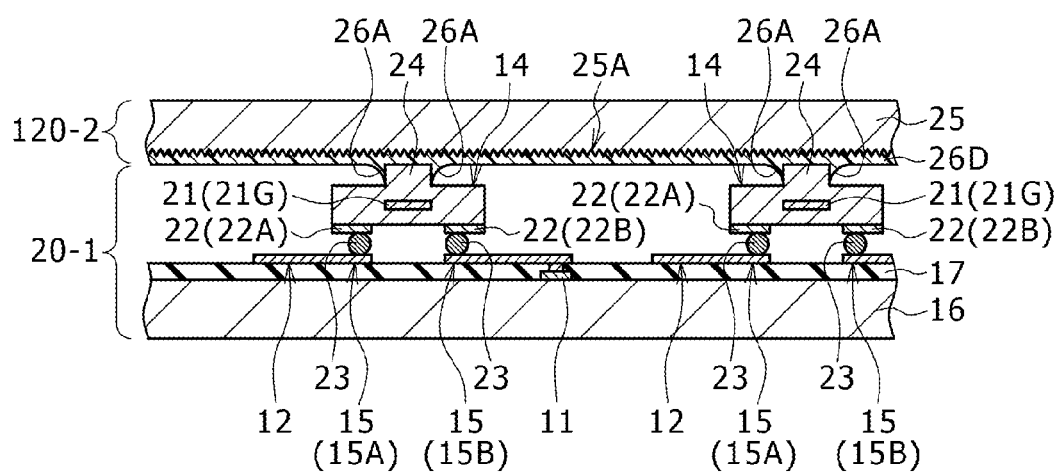

Now, an example of the method of manufacturing the illumination panel 20 according to the present embodiment will be described below, referring to FIGS. 17A to 17D. FIGS. 17A and 17B are sectional views for illustrating an example of a process of manufacturing the illumination panel 20. FIGS. 17C and 17D are sectional views for illustrating steps subsequent to FIGS. 17A and 17B.

First, for example, a plurality of light-emitting devices 14 are mounted on a circuit substrate 120-1 having formed on the base material 16 the insulating layer 17 including a plurality of data wires 11 therein and a wiring pattern (the scan wires 12 and the pad electrodes 15) (FIG. 17A). Thereafter, reflow is applied to the circuit substrate 120-1, whereby the electrodes 22 of the light-emitting devices 14 are bonded to the pad electrodes 15 through the solder 23. As a result, the mounting substrate 20-1 is formed. Incidentally, the electrodes 22 of the light-emitting devices 14 may be bonded to the pad electrodes 15 by a plating treatment, without using the solder 23. Subsequently, for example, a liquid or gel-form curable resin layer 26D is formed on the transparent substrate 25 (FIG. 17B). By this, the transparent substrate 120-2 is formed. The resin layer 26D is formed, for example, by use of spin coating or the like.

Next, the mounting substrate 20-1 and the transparent substrate 120-2 are so disposed as to cause the light-emitting devices 14 and the resin layer 26D to face each other, and, further, they are adhered to each other so that the light-emitting devices 14 make contact with the resin layer 26D (FIGS. 17C and 17D). In this instance, a pressure is applied to the mounting substrate 20-1 and the transparent substrate 120-2 so that the load on each of the projections 24 is about 0.1 g, for example. As a result, the fillet 26A spreading from the light-emitting device 14 side toward the transparent substrate 120-2 side is formed at that part of the resin layer 26D which is in contact with each of the light-emitting devices 14, as shown in FIG. 17D. Thereafter, the resin layer 26D is dried, to solidify the fillets 26A (not shown). In this manner, the illumination panel 20 according to the present embodiment is manufactured.

Operation and Effect of Illumination Device 2

In the present embodiment, the light-emitting devices 14 are driven by the data wires 11 and the scan wires 12 which are laid out in a simple matrix. This ensures that the light-emitting devices 14 provided in the vicinity of the intersection areas of the data wires 11 and the scan wires 12 are supplied with a current, whereby illumination light is outputted from the illumination region 20A.

Meanwhile, in the present embodiment, in adhering the mounting substrate 20-1 and the transparent substrate 120-2 to each other, the light-emitting devices 14 on the mounting substrate 20-1 and the resin layer 26D on the transparent substrate 120-2 are brought into contact with each other, and the fillets 26A spreading from the light-emitting device 14 side toward the transparent base material 25 side are formed at those portions of the resin layer 26D which make contact with the light-emitting devices 14. This ensures that when the light-emitting device 14 is driven to emit light, the light emitted obliquely from the light-emitting device 14 is reflected by the fillet 26A toward the transparent base material 25 side, and the thus reflected light is transmitted through the transparent base material 25, to go out to the exterior. As a result, the possibility of a phenomenon in which part of the light emitted obliquely from the light-emitting device 14 is reflected on the back surface of the transparent substrate 20-2 or is confined in the transparent base material 25, generating stray light, can be lowered. Accordingly, the light extraction efficiency can be restrained from being lowered due to the presence of the transparent substrate 20-2 on the light outgoing side.

In addition, in the present embodiment, in the case where the projection 24 is provided in that region of the top surface of the light-emitting device 14 which faces the light-emitting element 21 and where the fillet 26A is formed on the side surface of the projection 24, the light emitted obliquely from the light-emitting device 14 can be extracted with a more enhanced efficiency. In this case, therefore, the light extraction efficiency can be further restrained from being lowered due to the transparent substrate 20-2.

Besides, in the present embodiment, in the case where the surface of the transparent base material 25 on the resin layer 26 side is the rough surface 25A, part of the light emitted obliquely from the light-emitting device 14 is scattered on the rough surface 25A. In this case, part of the scattered light is transmitted through the transparent base material 25, to go out to the exterior. Therefore, the possibility of a phenomenon in which the light emitted obliquely from the light-emitting device 14 is reflected on the back surface of the transparent substrate 20-2 or is confined in the transparent base material 25, generating stray light, can be lowered. Consequently, the light extraction efficiency can be further restrained from being lowered due to the transparent substrate 20-2.

In addition, in the present embodiment, the mounting substrate 20-1 is provided with the plurality of struts 19 which regulate the spacing between the mounting substrate 20-1 and the transparent substrate 20-2, so that the spacing between the mounting substrate 20-1 and the transparent substrate 20-2 can be made uniform in plane. This makes it possible to make the shape of the fillets 26A uniform in plane, and therefore to restrain the light extraction efficiency from being partially lowered in plane. Consequently, the light extraction efficiency can be further restrained from being lowered due to the transparent substrate 20-2.

Besides, in the present embodiment, in the case where the black 18 is provided at the surface of the mounting substrate 20-1, it is unnecessary to provide a black on the transparent substrate 20-2 side. In this case, there is no need for alignment in adhering the mounting substrate 20-1 and the transparent substrate 120-2 to each other in the manufacturing process, so that an enhanced productivity is secured.

In addition, in the present embodiment, the electrodes 22 of the light-emitting devices 14 are connected to the pad electrodes 15 through the solder 23. This ensures that, even when the electrodes 22 of the light-emitting device 14 is for example mounted at locations slightly deviated from the centers of the pad electrodes 15 in the manufacturing process, the later reflow permits the electrodes 22 of the light-emitting device 14 to spontaneously move to the centers of the pad electrodes 15. Accordingly, the trouble arising from misalignment of the light-emitting devices 14 can be substantially eliminated.

Besides, in the present embodiment, no aperture is provided on the transparent substrate 20-2 side for the purpose of enhancing the light extraction efficiency, and, therefore, unevenness of view angle can be reduced.

While the present technology has been described above by showing a plurality of embodiments and modifications thereof, the present technology is not limited to the above-described embodiments and the like, and various alterations are possible.

For instance, while the light-emitting device 14 has included a plurality of light-emitting elements 21 in the above embodiments and the like, the light-emitting device 14 may include only one light-emitting element. In addition, while a plurality of light-emitting devices 14 have been mounted on the mounting substrate 10-1, 20-1 in the above embodiments and the like, mounting of only one light-emitting device 14 on the mounting substrate may be adopted. Besides, while a plurality of light-emitting devices 14 have been mounted in a matrix pattern in the above embodiments and the like, they may be mounted in a line or lines. In addition, while data wires 11 and scan wires 12 laid out in a simple matrix have been used as wiring for driving the light-emitting devices 14 on the mounting substrate 10-1, 20-1 in the above embodiments and the like, wiring patterns laid out in other forms can also be used as the wiring for driving.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display panel comprising:
a mounting substrate in which one or more light-emitting devices each including one or more light-emitting elements are mounted on a circuit substrate; and
a transparent substrate disposed to face the light-emitting device side of the mounting substrate,
wherein the transparent substrate has a transparent base material and a resin layer formed on a mounting substrate side of the transparent base material, and
the resin layer is in contact with the light-emitting device and has, formed on an upper surface or a side surface of the light-emitting device, an inclined part which spreads from a light-emitting device side toward a transparent base material side.

2. The display panel according to claim 1,
wherein a surface of the inclined part is paraboloidal in shape.

3. The display panel according to claim 2,
wherein the inclined part is formed by disposing a liquid or gel-form curable resin layer on the transparent base material, bringing the curable resin layer and the light-emitting device or devices into contact with each other, and sucking up part of the curable resin layer along a surface or surfaces of the light-emitting device or devices.

4. The display panel according to claim 1,
wherein the light-emitting device has a projection in that region of an upper surface thereof which faces the light-emitting element, and
the inclined part is formed on a side surface of the projection.

5. The display panel according to claim 4,
wherein the mounting substrate has a lens-shaped covering part covering entirely or partly that part of the light-emitting device which is not covered with the resin layer.

6. The display panel according to claim 1,
wherein an upper surface of the light-emitting device is a flat surface, and
the inclined part is formed on a side surface of the light-emitting device.

7. The display panel according to claim 1,
wherein a surface on the resin layer side of the transparent base material is a rough surface.

8. The display panel according to claim 1,
wherein the mounting substrate has a plurality of struts which regulate the spacing between the mounting substrate and the transparent substrate.

9. The display panel according to claim 1,
wherein the mounting substrate has a wiring pattern electrically connected to the light-emitting device, and has a light-absorbing layer in at least that region in which the wiring pattern is not formed.

10. The display panel according to claim 1,
wherein the transparent substrate has a light-absorbing layer between the transparent base material and the resin layer and in that region which does not face the light-emitting element.

11. A display device comprising:
a display panel; and
a driving part which drives the display panel,
wherein the display panel includes
a mounting substrate in which one or more light-emitting devices each including one or more light-emitting elements are mounted on a circuit substrate, and
a transparent substrate disposed to face the light-emitting device side of the mounting substrate,
wherein the transparent substrate has a transparent base material and a resin layer formed on a mounting substrate side of the transparent base material, and
wherein the resin layer is in contact with the light-emitting device and has, formed on an upper surface or a side surface of the light-emitting device, an inclined part which spreads from a light-emitting device side toward a transparent base material side.

12. An illumination panel comprising:
a mounting substrate in which one or more light-emitting devices each including one or more light-emitting elements are mounted on a circuit substrate; and
a transparent substrate disposed to face the light-emitting device side of the mounting substrate,
wherein the transparent substrate has a transparent base material and a resin layer formed on a mounting substrate side of the transparent base material, and
wherein the resin layer is in contact with the light-emitting device and has, formed on an upper surface or a side surface of the light-emitting device, an inclined part which spreads from a light-emitting device side toward a transparent base material side.

13. An illumination device comprising:
an illumination panel; and
a driving part which drives the illumination panel,
wherein the illumination panel includes
a mounting substrate in which one or more light-emitting devices each including one or more light-emitting elements are mounted on a circuit substrate, and
a transparent substrate disposed to face the light-emitting device side of the mounting substrate,
wherein the transparent substrate has a transparent base material and a resin layer formed on a mounting substrate side of the transparent base material, and
wherein the resin layer is in contact with the light-emitting device and has, formed on an upper surface or a side surface of the light-emitting device, an inclined part which spreads from a light-emitting device side toward a transparent base material side.

14. A method of manufacturing a display panel, the method comprising:
adhering a mounting substrate in which one or more light-emitting devices each including one or more light-emitting elements are mounted on a circuit substrate to a transparent substrate having a liquid or gel-form curable resin layer on a transparent base material so as to bring the light-emitting device and the curable resin layer into contact with each other,
wherein an inclined part spreading from a light-emitting device side toward a transparent substrate side is formed in that part of the curable resin layer which makes contact with the light-emitting device.

15. A method of manufacturing an illumination panel, the method comprising:
adhering a mounting substrate in which one or more light-emitting devices each including one or more light-emitting elements are mounted on a circuit substrate to a transparent substrate having a liquid or gel-form curable resin layer on a transparent base material so as to bring the light-emitting device and the curable resin layer into contact with each other,
wherein an inclined part spreading from a light-emitting device side toward a transparent substrate side is formed in that part of the curable resin layer which makes contact with the light-emitting device.

16. A display panel comprising:
a mounting substrate in which one or more light-emitting devices each including one or more light-emitting elements are mounted on a circuit substrate; and
a transparent substrate disposed to face the light-emitting device side of the mounting substrate,
wherein the transparent substrate includes a transparent base material and a resin layer formed on a mounting substrate side of the transparent base material, and
wherein the resin layer is in contact with the light-emitting device and has formed on an upper surface or a side surface of the light-emitting device a light reflecting part which reflects the light from the light-emitting device toward the transparent base material.

* * * * *